US010916731B2

(12) United States Patent
He

(10) Patent No.: US 10,916,731 B2
(45) Date of Patent: Feb. 9, 2021

(54) ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chunmei He, Wuhan (CN)

(*) Notice: Subject to any disclaimer, the term of this patent is extended or adjusted under 35 U.S.C. 154(b) by 27 days.

(21) Appl. No.: 16/315,641

(22) PCT Filed: Oct. 10, 2018

(86) PCT No.: PCT/CN2018/109739
§ 371 (c)(1),
(2) Date: Jan. 6, 2019

(87) PCT Pub. No.: WO2020/051964
PCT Pub. Date: Mar. 19, 2020

(65) Prior Publication Data
US 2020/0083486 A1 Mar. 12, 2020

(30) Foreign Application Priority Data
Sep. 11, 2018 (CN) .......................... 2018 1 1057933

(51) Int. Cl.
*H01L 51/52* (2006.01)
*H01L 51/00* (2006.01)

(52) U.S. Cl.
CPC ...... *H01L 51/5284* (2013.01); *H01L 51/0097* (2013.01); *H01L 51/5253* (2013.01); *H01L 2251/5338* (2013.01); *H01L 2251/558* (2013.01)

(58) Field of Classification Search
CPC .................................................. H01L 51/5284
See application file for complete search history.

(56) References Cited

U.S. PATENT DOCUMENTS

| | | | |
|---|---|---|---|
| 2003/0203551 A1 | 10/2003 | Cok | |
| 2012/0033165 A1* | 2/2012 | Lee | G02F 1/13394 349/110 |
| 2014/0209913 A1* | 7/2014 | Song | H01L 27/1248 257/72 |
| 2016/0254336 A1 | 9/2016 | Zhang et al. | |
| 2017/0062772 A1 | 3/2017 | Chu et al. | |
| 2019/0244975 A1* | 8/2019 | He | H01L 27/124 |
| 2020/0052056 A1* | 2/2020 | Park | H01L 27/3262 |

FOREIGN PATENT DOCUMENTS

| | | |
|---|---|---|
| CN | 202013465 U | 10/2011 |
| CN | 103500753 A | 1/2014 |
| CN | 203644785 U | 6/2014 |
| CN | 104155791 A | 11/2014 |
| CN | 105070741 A | 11/2015 |

* cited by examiner

*Primary Examiner* — Peniel M Gumedzoe
*Assistant Examiner* — Christopher A Johnson

(57) ABSTRACT

An organic light emitting diode (OLED) display device includes an OLED display panel, where a surface of the OLED display panel includes a plurality of pixel display units and a plurality of non-pixel display units; an optical film including an optical film body layer, a black matrix layer, a protective layer, and an adhesive layer which are disposed layer by layer, where the black matrix layer includes a plurality of first black matrix layers and a plurality of second black matrix layers, each of the first black matrix layers is alternated with each of the second black matrix layers.

14 Claims, 4 Drawing Sheets

ORGANIC LIGHT EMITTING DIODE DISPLAY DEVICE

FIELD OF DISCLOSURE

The present disclosure relates to the field of display technologies, and more particularly to an organic light emitting diode (OLED) display device.

BACKGROUND

At present, consumers are increasingly demanding foldable and curl-able electronic products. To achieve folding or curling, a thickness of each optical film layer needs to be as thin as possible. In order to prevent components in an OLED display panel from decreasing ambient light reflection display quality, it is generally required to attach an anti-reflective polarizer to the OLED display panel. although the display quality can be ensured, there will be a certain emitted light loss of the OLED display panel due to the polarizer, and reduce display brightness of the OLED display panel. Moreover, the polarizer is generally thick, which is not conducive to bending of the OLED display panel. If a material of the prior art polarizer is a polyvinyl alcohol film, problems of moisture absorption and warpage are difficult to solve, and adhesion of coating is poor.

In summary, due to the thick polarizer, the existing OLED display device has a certain loss of the light emitted from the OLED display panel, which leads to technical problems such as the OLED display device being difficult to bend and the display brightness being low.

SUMMARY OF THE DISCLOSURE

Due to the thick polarizer, the existing OLED display device has a certain loss of the light emitted from the OLED display panel, which causes the OLED display device to be not easily bent and has low display brightness.

The present disclosure provides an organic light emitting diode (OLED) display device includes an OLED display panel and an optical film.

A surface of the OLED display panel includes a plurality of pixel display units and a plurality of non-pixel display units, and each of the pixel display units is alternated with each of the non-pixel display units. The optical film includes an optical film body layer, a black matrix layer, a protective layer, and an adhesive layer which are disposed layer by layer, where the optical film is attached to the OLED display panel through the adhesive layer; where the black matrix layer includes a plurality of first black matrix layers and a plurality of second black matrix layers, each of the first black matrix layers is alternated with each of the second black matrix layers, and each of the first black matrix layers and each of the second black matrix layers are formed via photoetching and high temperature curing of the black matrix layer.

In the OLED display device of the present disclosure, each of the first black matrix layers is matched with each of the pixel display units, and each of the second black matrix layers is matched with each of the non-pixel display units.

In the OLED display device of the present disclosure, a thickness of each of the first black matrix layers is greater than a thickness of each of the second black matrix layers.

In the OLED display device of the present disclosure, each of the first black matrix layers has an optical density greater than four.

In the OLED display device of the present disclosure, a transmittance of each of the pixel display units ranges from 50% to 60%, and an optical density of each of the pixel display units is less than two.

In the OLED display device of the present disclosure, the protective layer is an organic layer or an inorganic layer.

In the OLED display device of the present disclosure, the protective layer has a thickness less than 1 micron.

In the OLED display device of the present disclosure, the surface of the OLED display panel is provided with a polyimide layer, and each of the pixel display units and each of the non-pixel display units are located on the polyimide layer.

In the OLED display device of the present disclosure, a material of the optical film body layer is any one of polyimide, cyclic olefins polymer, and polyethylene glycol terephthalate.

The present disclosure also provides an organic light emitting diode (OLED) display device includes an OLED display panel and an optical film.

A surface of the OLED display panel includes a plurality of pixel display units and a plurality of non-pixel display units, and each of the pixel display units is alternated with each of the non-pixel display units. The optical film includes an optical film body layer, a black matrix layer, a protective layer, and an adhesive layer which are disposed layer by layer, where the optical film is attached to the OLED display panel through the adhesive layer; where the black matrix layer includes a plurality of first black matrix layers and a plurality of second black matrix layers, each of the first black matrix layers is alternated with each of the second black matrix layers.

In the OLED display device of the present disclosure, each of the first black matrix layers is matched with each of the pixel display units, and each of the second black matrix layers is matched with each of the non-pixel display units.

In the OLED display device of the present disclosure, a thickness of each of the first black matrix layers is greater than a thickness of each of the second black matrix layers.

In the OLED display device of the present disclosure, each of the first black matrix layers has an optical density greater than four.

In the OLED display device of the present disclosure, a transmittance of each of the pixel display units ranges from 50% to 60%, and an optical density of each of the pixel display units is less than two.

In the OLED display device of the present disclosure, the protective layer is an organic layer or an inorganic layer.

In the OLED display device of the present disclosure, the protective layer has a thickness less than 1 micron.

In the OLED display device of the present disclosure, the surface of the OLED display panel is provided with a polyimide layer, and each of the pixel display units and each of the non-pixel display units are located on the polyimide layer.

In the OLED display device of the present disclosure, a material of the optical film body layer is any one of polyimide, cyclic olefins polymer, and polyethylene glycol terephthalate.

The advantages of the present disclosure are that in the OLED display device of the present disclosure, a black matrix with different thicknesses is used to replace a polarizer, which simplifies a structure of the OLED display device, and further solves the problem that the OLED display device is not easily bent due to the thick polarizer, and further reduces the reflectivity of the OLED display device.

BRIEF DESCRIPTION OF THE DRAWINGS

In order to more clearly describe the technical solutions of the embodiments of the present disclosure, accompanying drawings to be used in the detailed description of the disclosure will be briefly described hereinbelow. Obviously, the accompanying drawings described hereinbelow only illustrate some of the embodiments of the present disclosure, and those of ordinary skill in the art can also obtain other accompanying drawings therefrom without the need of making inventive efforts.

DETAILED DESCRIPTION

Figure 1:
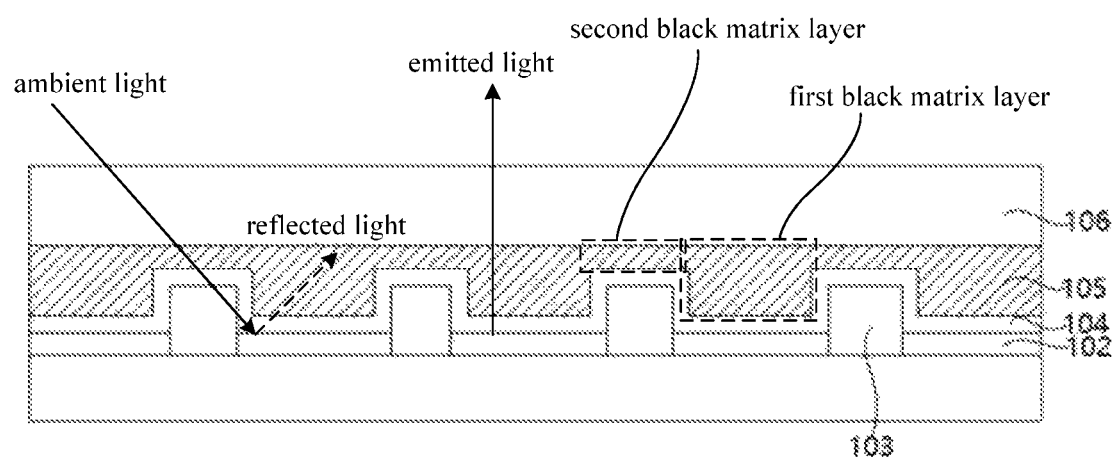
FIG. 1 is a schematic diagram of an OLED display device of the present disclosure.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present application can solve technical problems that an OLED display device is not easy to bend and the display brightness is low, because a polarizer is thick and causes a certain loss to the light emitted from the OLED display panel.

As shown in FIG. 1, the present disclosure provides an OLED display device, including:

an OLED display panel, where a surface of the OLED display panel includes a plurality of pixel display units 102 and a plurality of non-pixel display units 103, and each of the pixel display units 102 is alternated with each of the non-pixel display units 103;

an optical film including an optical film body layer 106, a black matrix layer 105, a protective layer 104, and an adhesive layer which are disposed layer by layer, where the optical film is attached to the OLED display panel through the adhesive layer;

The black matrix layer 105 includes a plurality of first black matrix layers and a plurality of second black matrix layers, each of the first black matrix layers is alternated with each of the second black matrix layers.

Figure 2:
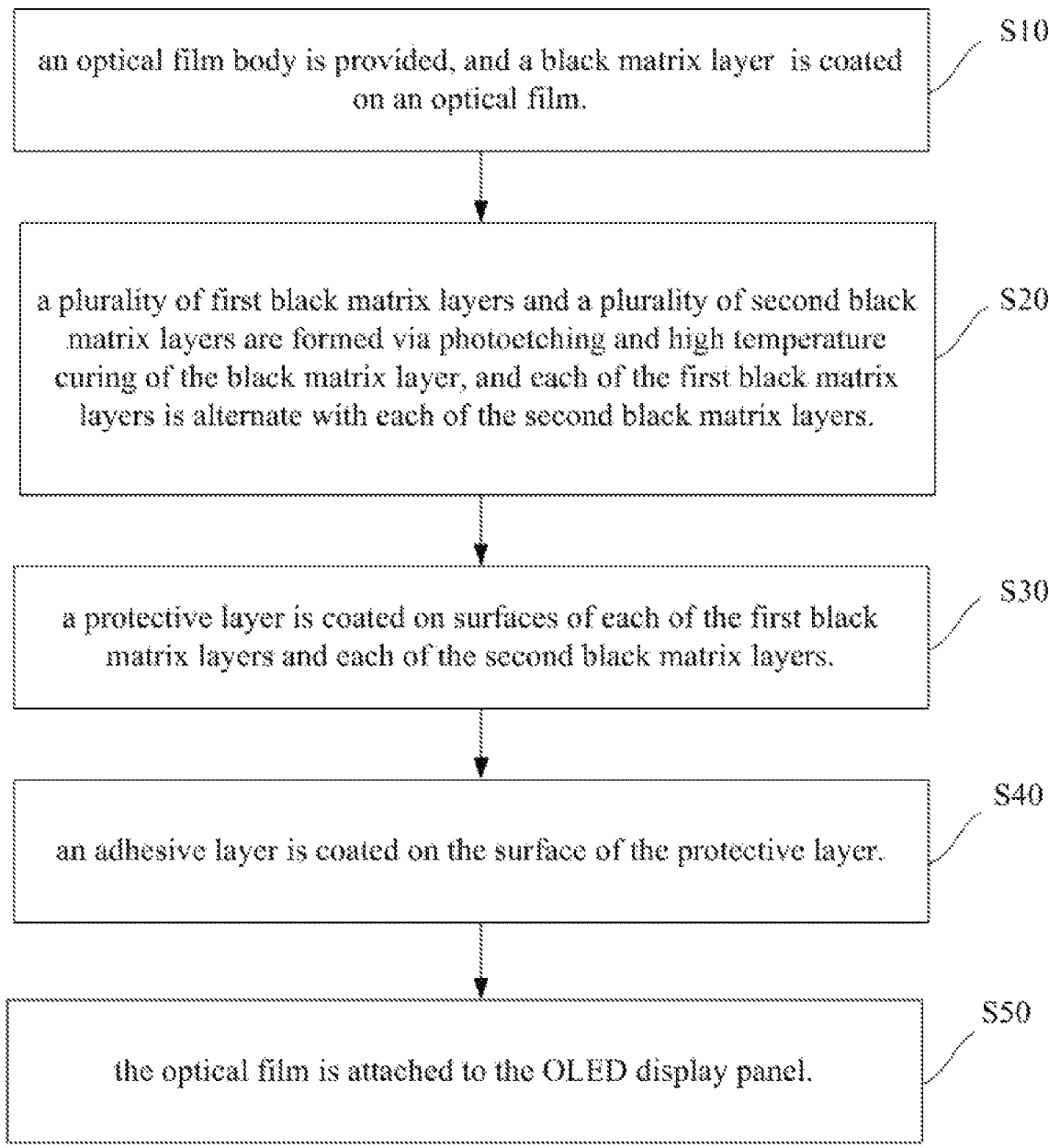
FIG. 2 is a flowchart of manufacturing method of an OLED display device of the present disclosure.

As shown in FIG. 2, the present disclosure provides a manufacturing method of an OLED display device. The method includes the following.

S10, an optical film body 201 is provided. A black matrix layer 202 is coated on an optical film 201.

Specifically, the S10 also includes the following.

Figure 2A:
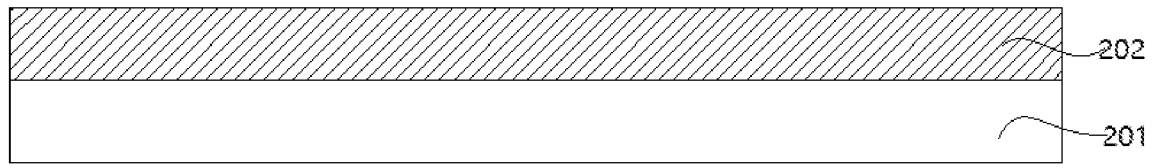
FIGS. 2A-2E are a schematic diagrams of the manufacturing method of the OLED display device of FIG. 2.

A material of the optical film body 201 is any one of polyimide, cyclic olefins polymer, and polyethylene glycol terephthalate. A material of the optical film body 201 is preferably a polyethylene glycol terephthalate film having no phase difference. The black matrix layer 202 is coated on the optical film body 201, a thickness of the black matrix layer 202 is the same as a thickness of the optical film body 201, as shown in FIG. 2A.

S20, a plurality of first black matrix layers and a plurality of second black matrix layers are formed via photoetching and high temperature curing of the black matrix layer 202. Each of the first black matrix layers is alternate with each of the second black matrix layers.

Specifically, the S20 also includes the following.

Figure 2B:
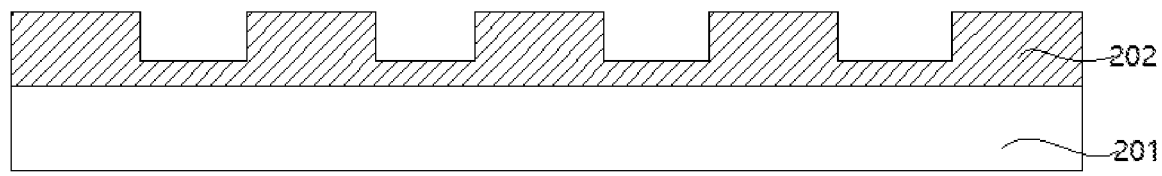

Firstly, the black matrix layer 202 is photo-etched to obtain a black matrix layer having different thicknesses, and then the black matrix layer having different thicknesses is cured by high temperature to form the plurality of first black matrix layers and the plurality of second black matrix layers. As shown in FIG. 2B, each of the first black matrix layers is alternate with each of the second black matrix layers.

The thickness of the first black matrix layer is greater than the thickness of the second black matrix layer. An optical density of the first black matrix layer is greater than 4, and an optical density of the second black matrix layer is greater than 4.

S30, a protective layer 203 is coated on the surface of each of the first black matrix layers and each of the second black matrix layers.

Specifically, the S30 also includes the following.

Figure 2C:
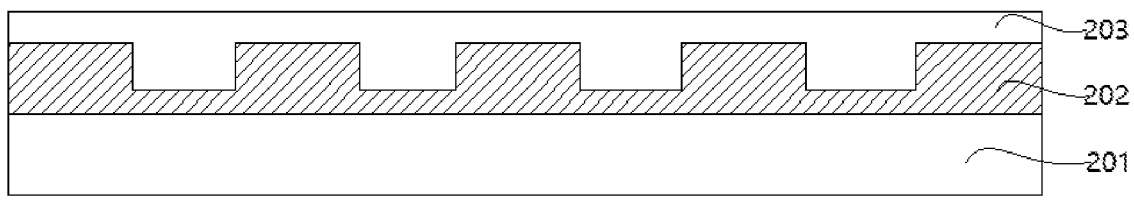

The protective layer 203 is coated on the surface of each of the first black matrix layers and each of the second black matrix layers, where the protective layer 203 is an organic layer or an inorganic layer. The protective layer 203 has a thickness of less than 1 micron. The protective layer 203 is coated on the surface of each of the first black matrix layers and each of the second black matrix layers, so that the black matrix layer 202 can be planarized. On the other hand, a separation of the adhesive from the black matrix layer 202 can be effectively prevented, as shown in FIG. 2C.

S40, an adhesive layer 204 is coated on the surface of the protective layer 203.

Specifically, the S40 also includes the following.

Figure 2D:
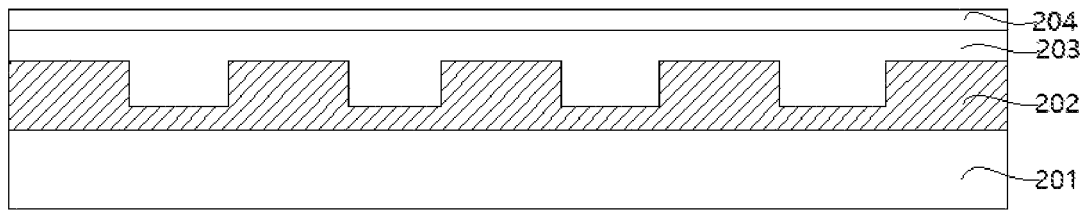

As shown in FIG. 2D, a function of the adhesive layer 204 is mainly to bond the optical film to the OLED display panel.

S50, the optical film is attached to the OLED display panel.

Specifically, the S50 also includes the following.

Figure 2E:
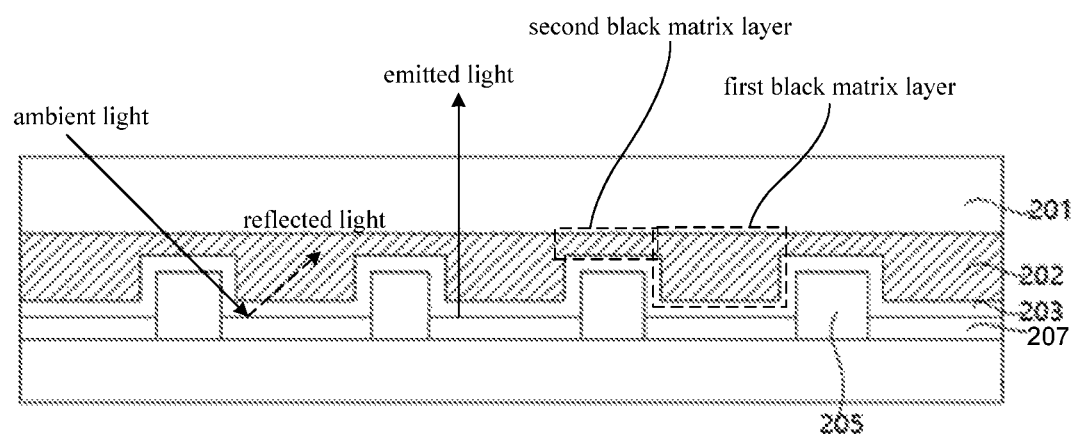

The surface of the OLED display panel includes a plurality of pixel display units 207 and a plurality of non-pixel display units 205, and each of the pixel display units 207 is alternated with each of the non-pixel display units 205. The surface of the OLED display panel is provided with a polyimide layer. Each of the pixel display units 207 and each of the non-pixel display units 205 are located in the polyimide layer. A transmittance of each of the pixel display units 207 ranges from 50% to 60%, and an optical density of each of the pixel display units 207 is less than two. As shown in FIG. 2E, each of the first black matrix layers is matched with each of the pixel display units 207, and each of the second black matrix layers is matched with each of the non-pixel display units 205.

After the optical film is attached to the OLED display panel, each of the first black matrix layers on a side of the optical film is attached to the pixel display unit 207 on a side of the OLED display panel. Each of the second black matrix layers on the side of the optical film is attached to the non-pixel display unit 205 on the side of the OLED display panel. The thickness of each of the first black matrix layers is greater than the thickness of the pixel display unit 207. The optical density of the pixel display unit 207 is less than 2 to ensure that the light transmission of the OLED illumination area can still be 50% to 60%, and the reflected light of this area is reduced.

The advantages of the present disclosure are that in the OLED display device of the present disclosure, a black matrix with different thicknesses is used to replace a polarizer, which simplifies a structure of the OLED display device, and further solves the problem that the OLED display device is not easily bent due to the thick polarizer, and further reduces the reflectivity of the OLED display device.

The above descriptions are merely preferable embodiments of the present disclosure, and are not intended to limit the scope of the present disclosure. Any modification or replacement made by those skilled in the art without departing from the spirit and principle of the present disclosure should fall within the protection scope of the present disclosure. Therefore, the protection scope of the present disclosure is subject to the appended claims.

What is claimed is:

1. An organic light emitting diode (OLED) display device, comprising:
    an OLED display panel, wherein a surface of the OLED display panel comprises a plurality of pixel display units and a plurality of non-pixel display units, each of the pixel display units alternating with each of the non-pixel display units, wherein a transmittance of each of the pixel display units ranges from 50% to 60%, and an optical density of each of the pixel display units is less than two;
    an optical film comprising an optical film body layer, a black matrix layer, and a protective layer which are disposed layer by layer, wherein the optical film is attached to the OLED display panel;
    wherein the black matrix layer comprises a plurality of first black matrix layers and a plurality of second black matrix layers, each of the first black matrix layers is alternated with each of the second black matrix layers, and each of the first black matrix layers and each of the second black matrix layers are formed via photoetching and high temperature curing of the black matrix layer.

2. The OLED display device as claimed in claim 1, wherein each of the first black matrix layers is matched with each of the pixel display units, and each of the second black matrix layers is matched with each of the non-pixel display units.

3. The OLED display device as claimed in claim 2, wherein a thickness of each of the first black matrix layers is greater than a thickness of each of the second black matrix layers.

4. The OLED display device as claimed in claim 3, wherein each of the first black matrix layers has an optical density greater than four.

5. The OLED display device as claimed in claim 1, wherein the protective layer is an inorganic layer.

6. The OLED display device as claimed in claim 5, wherein the protective layer has a thickness less than 1 micron.

7. The OLED display device as claimed in claim 1, wherein a material of the optical film body layer is any one of polyimide, cyclic olefins polymer, and polyethylene glycol terephthalate.

8. An organic light emitting diode (OLED) display device, comprising:
    an OLED display panel, wherein a surface of the OLED display panel comprises a plurality of pixel display units and a plurality of non-pixel display units, and each of the pixel display units is alternated with each of the non-pixel display units, wherein a transmittance of each of the pixel display units ranges from 50% to 60%, and an optical density of each of the pixel display units is less than two;
    an optical film comprising an optical film body layer, a black matrix layer, and a protective layer which are disposed layer by layer, wherein the optical film is attached to the OLED display panel;
    wherein the black matrix layer comprises a plurality of first black matrix layers and a plurality of second black matrix layers, each of the first black matrix layers is alternated with each of the second black matrix layers.

9. The OLED display device as claimed in claim 8, wherein each of the first black matrix layers is matched with each of the pixel display units, and each of the second black matrix layers is matched with each of the non-pixel display units.

10. The OLED display device as claimed in claim 9, wherein a thickness of each of the first black matrix layers is greater than a thickness of each of the second black matrix layers.

11. The OLED display device as claimed in claim 10, wherein each of the first black matrix layers has an optical density greater than four.

12. The OLED display device as claimed in claim 8, wherein the protective layer is an inorganic layer.

13. The OLED display device as claimed in claim 12, wherein the protective layer has a thickness less than 1 micron.

14. The OLED display device as claimed in claim 8, wherein a material of the optical film body layer is any one of polyimide, cyclic olefins polymer, and polyethylene glycol terephthalate.

* * * * *